(12) United States Patent
Ohkura

(10) Patent No.: US 7,642,799 B2
(45) Date of Patent: Jan. 5, 2010

(54) TEST CHIP SOCKET AND METHOD FOR TESTING A CHIP

(75) Inventor: Yoshihiro Ohkura, Shizuoka-Ken (JP)

(73) Assignee: Yamaha Corporation, Shizuoka-ken (JP)

( * ) Notice: Subject to any disclaimer, the term of this patent is extended or adjusted under 35 U.S.C. 154(b) by 0 days.

(21) Appl. No.: 11/841,396

(22) Filed: Aug. 20, 2007

(65) Prior Publication Data
US 2008/0054925 A1 Mar. 6, 2008

(30) Foreign Application Priority Data
Aug. 21, 2006 (JP) .............................. 2006-224650

(51) Int. Cl.
G01R 31/26 (2006.01)
(52) U.S. Cl. .................... 324/765; 324/158.1
(58) Field of Classification Search ......... 324/755–765; 439/70–73, 620.2–620.25
See application file for complete search history.

(56) References Cited

U.S. PATENT DOCUMENTS

| 5,363,038 | A | * | 11/1994 | Love | 324/158.1 |
| 5,528,466 | A | * | 6/1996 | Lim et al. | 361/820 |
| 5,604,445 | A | * | 2/1997 | Desai et al. | 324/755 |
| 5,745,346 | A | * | 4/1998 | Ogawa et al. | 361/769 |
| 5,805,472 | A | * | 9/1998 | Fukasawa | 702/118 |
| 5,955,888 | A | * | 9/1999 | Frederickson et al. | 324/761 |
| 5,990,692 | A | * | 11/1999 | Jeong et al. | 324/755 |
| 6,025,732 | A | * | 2/2000 | Foo et al. | 324/760 |
| 6,636,057 | B1 | * | 10/2003 | Uchikura | 324/754 |
| 7,316,573 | B2 | * | 1/2008 | Xie et al. | 439/66 |
| 2003/0057984 | A1 | * | 3/2003 | Akram | 324/755 |
| 2004/0126522 | A1 | * | 7/2004 | Extrand et al. | 428/35.7 |

FOREIGN PATENT DOCUMENTS

| JP | 05-251145 | 9/1993 |
| JP | 10-279067 | 10/1998 |
| JP | 2003-523073 | 7/2003 |
| WO | WO-00/35262 | 6/2000 |

* cited by examiner

Primary Examiner—Ha Tran T Nguyen
Assistant Examiner—Richard Isla Rodas
(74) Attorney, Agent, or Firm—Dickstein Shapiro LLP

(57) ABSTRACT

A test chip socket comprises a contact block fixed to a tester substrate, a tray mounted to the contact block, the tray having a convex part for positioning test target chips to a plurality of mount positions, and a plurality of probes each of which is held by the contact block and contacts the tester substrate and the test target chip, wherein each probe contacts with a terminal of each test target chip mounted to the mounting position when the tray mounting the plurality of the test target chip is fixed to the contact block.

7 Claims, 7 Drawing Sheets

FIG. 6

| TRAY ID | SECTION ID | MAGNETIC SENSOR TEST RESULT DATA | LSI TEST RESULT DATA |
|---|---|---|---|
| 001 | 001 | 1 | 1 |
|  | 002 | 0 | 1 |
|  | 003 | 1 | 1 |
|  | ... | ... | ... |
|  | 025 | 1 | 1 |
| 002 | 001 | 1 | 0 |
|  | 002 | 1 | 1 |
|  | ... | ... | ... |
| ... | ... | ... | ... |

TEST CHIP SOCKET AND METHOD FOR TESTING A CHIP

CROSS REFERENCE TO RELATED APPLICATION

This application is based on Japanese Patent Application 2006-224650, filed on Aug. 21, 2006, the entire contents of which are incorporated herein by reference.

BACKGROUND OF THE INVENTION

A) Field of the Invention

This invention relates to a test chip socket.

B) Description of the Related Art

Conventionally a test chip socket is used as a connector for connecting a tester substrate of a test system with a test target chip in a test process of a chip such as a packaged semiconductor integrated circuit.

However, it is impossible to insert a test target chip in a test chip socket and to remove the test target chip from the chip socket on a tester substrate by using an automatic handler. Therefore, in a process of testing a chipped circuit using a test chip socket, handwork to insert or remove the test target chip to or from the test chip socket one by one causes increase in a test cost.

Moreover, a size of a tester substrate is limited, and a test chip socket is quite larger than a test target chip. Therefore, even if a test system can mount plurality of test chip sockets on one tester substrate, the number of chips to be tested at once is less. This also causes increase in a cost of testing a chipped circuit.

SUMMARY OF THE INVENTION

It is an object of the present invention to provide a test chip socket to reduce a cost of testing a chipped circuit.

According to the present invention, there is provided a test chip socket, comprising: a contact block fixed to a tester substrate; a tray mounted to the contact block, the tray having a convex part for positioning test target chips to a plurality of mount positions; and a plurality of probes each of which is held by the contact block and contacts the tester substrate and the test target chip, wherein each probe contacts with a terminal of each test target chip mounted to the mounting position when the tray mounting the plurality of the test target chip is fixed to the contact block.

According to the above-described test chip socket, in a condition that the tray is removed from the contact block, a plurality of test target chips can be mounted to the plurality of mount positions of one tray and removed from tray; therefore, a process for mounting or removing a test target chip can be automated by using a handler. Moreover, a plurality of test target chips can be fixed to one contact block; therefore, the test target chips can be tested in a condition that the chips are arranged densely to the tester substrate. Therefore, this test chip socket can reduce a cost for testing a chipped circuit.

The above-described test chip socket may further comprise a positioning hole formed on the tray, and a guide rod that is formed on the contact block and is inserted to the positioning hole.

In this case, the tray can be positioned on the contact block by inserting the guide rod into the positioning hole when mounting the tray to the contact block.

The above-described test chip socket may further comprise a cover that covers the test target chips mounted on the tray and fixes the tray to the contact block, and the tray may comprise piercing holes to which the probes inserted, each piercing hole is formed in each of the plurality of mount positions, the contact block may comprise a base to which the probes are fixed, a table through which the probes pierce and on which the tray is placed, and a spring that support the table at a position separated from the base, the cover may connect to the base in a condition that the table is pushed into the base, and each of the probes may contact with a terminal of the test target chip exposing from the piercing hole when the cover connects with the base.

According to another aspect of the present invention, there is provided a test system to which the above-described test chip socket according to the present invention is fixed, the test system comprising: a tester substrate that tests signal processing circuits of magnetic sensor chips as the test target chips mounted to the contact block; and a data obtaining device that obtains test result data representing test results of the test target chips mounted to each mount position via the tester substrate.

According to this test system, a cost for testing signal processing circuits equipped to magnetic sensor chips can be reduced.

According to still another aspect of the present invention, there is provided a test system to which the above-described test chip socket according to the present invention is fixed, the test system comprising: a tester substrate; a reader that reads identification data of the tray; a data obtaining device that obtains test result data representing test results of the test target chips mounted to each mount position via the tester substrate; and an output device that outputs the test result data by correlating with the identification data.

According to this test system, the test result data for each test target chip, output from the test system can by managed by correlating to the identification data of the tray. Therefore, according to the test system, selection of acceptable test target chips can be automated by controlling a handler with the test result data managed in that manner. Moreover, the test result data output from a plurality of the test systems can be correlated with the identification data of the tray, so the plurality of the test target chips mounted on the tray can be handled when the test target chips are moved from one test system to another test system. Therefore, according to the test system, a cost for testing chipped circuit can be further reduced.

According to further aspect of the present invention, there is provided a method for testing a chip by using the above-described test system according to the present invention, the method comprising the steps of: mounting test target chips to the plurality of the mount positions; reading the identification data from the tray; obtaining test result data in a condition that the contact block fixes the tray to which the test target chips are mounted; outputting the test result data by correlating the identification data; removing the tray from the contact block; selecting an acceptable chip from the plurality of the test target chips mounted to the tray in accordance with the test result data correlated with the identification data of the removed tray.

According to the chip test method, selection of acceptable test target chips can be automated by controlling a handler with the test result data correlated to the identification data of the tray.

According to further aspect of the present invention, there is provided a test chip tray used as the tray for the above-described test target chips according to the present invention, the test chip tray comprising: convex parts that are higher than height of the test target chip, each convex part being formed in the mount position on one main surface of the test chip tray for positioning the test target chip; and concave parts formed on another main surface, and wherein each convex part can be set into each concave part so as to pile up the plurality of the test chip trays.

By using this test chip tray, a plurality of the test chip tray, to each of which the plurality of the test target chips are mounted, can be pilled up and handled in that condition; therefore, multiplicity of test target chips can be handled at once. Therefore, according to the test chip tray, a cost for testing chipped circuit can be further reduced.

BRIEF DESCRIPTION OF THE DRAWINGS

FIG. 6 is a data structure diagram showing data stored in a removable memory 41 after a magnetic sensor test and the LSI test according to the embodiment of the present invention.

DETAILED DESCRIPTION OF THE PREFERRED EMBODIMENTS

Figure 1A:
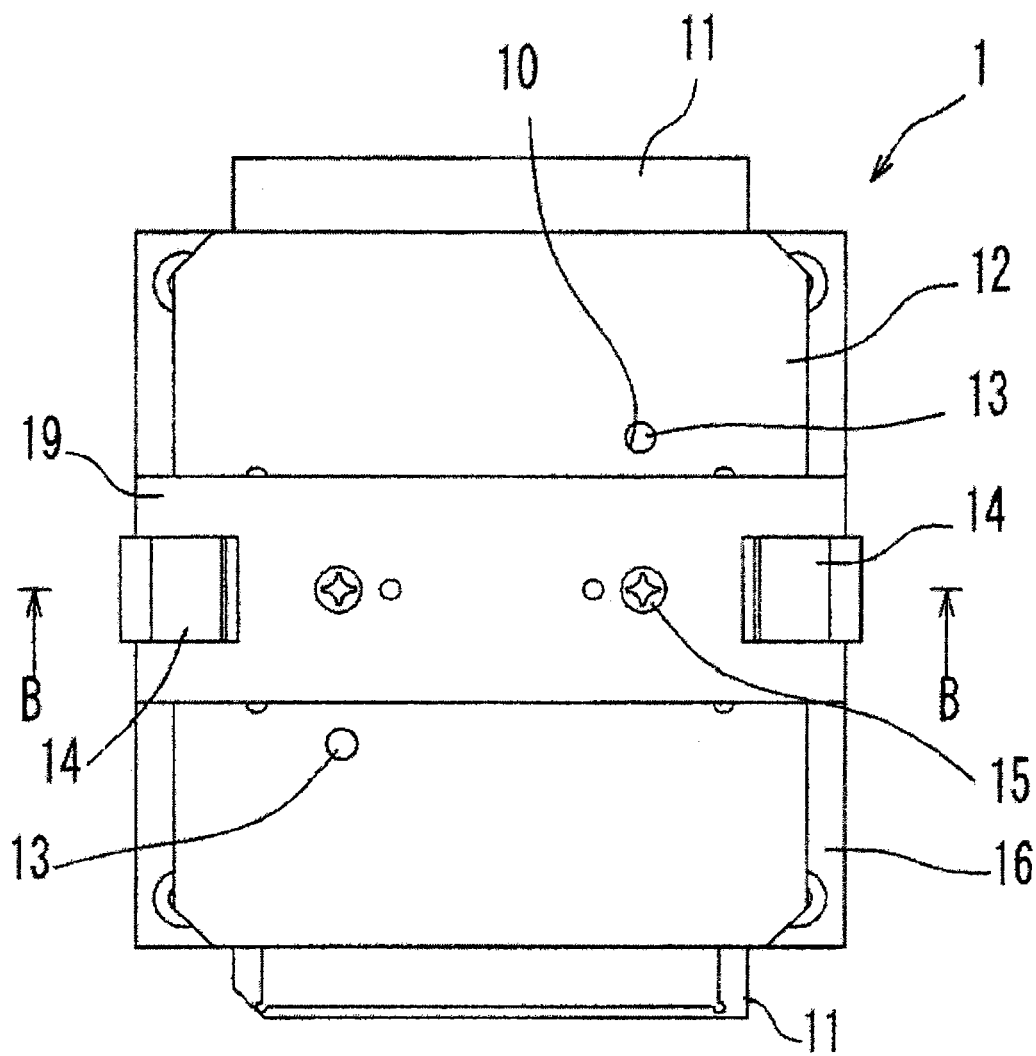
FIG. 1A is a plan view of a test chip socket according to an embodiment of the present invention.
Figure 1B:
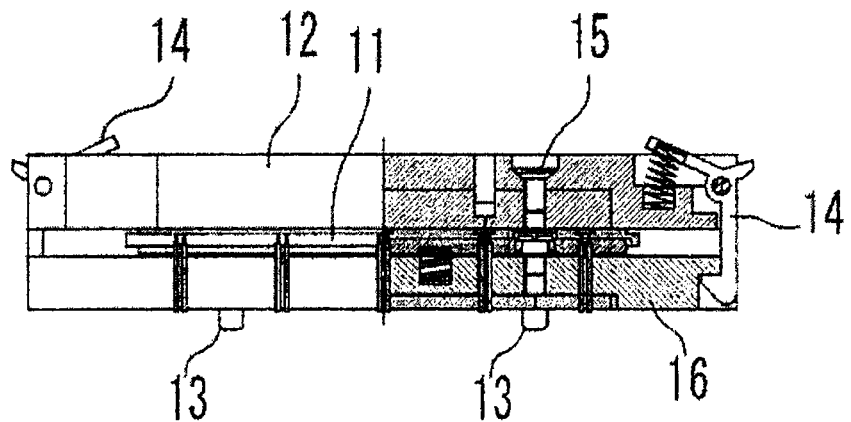
FIG. 1B is a partial cross sectional view between a line B to B in FIG. 1A.
Figure 1C:
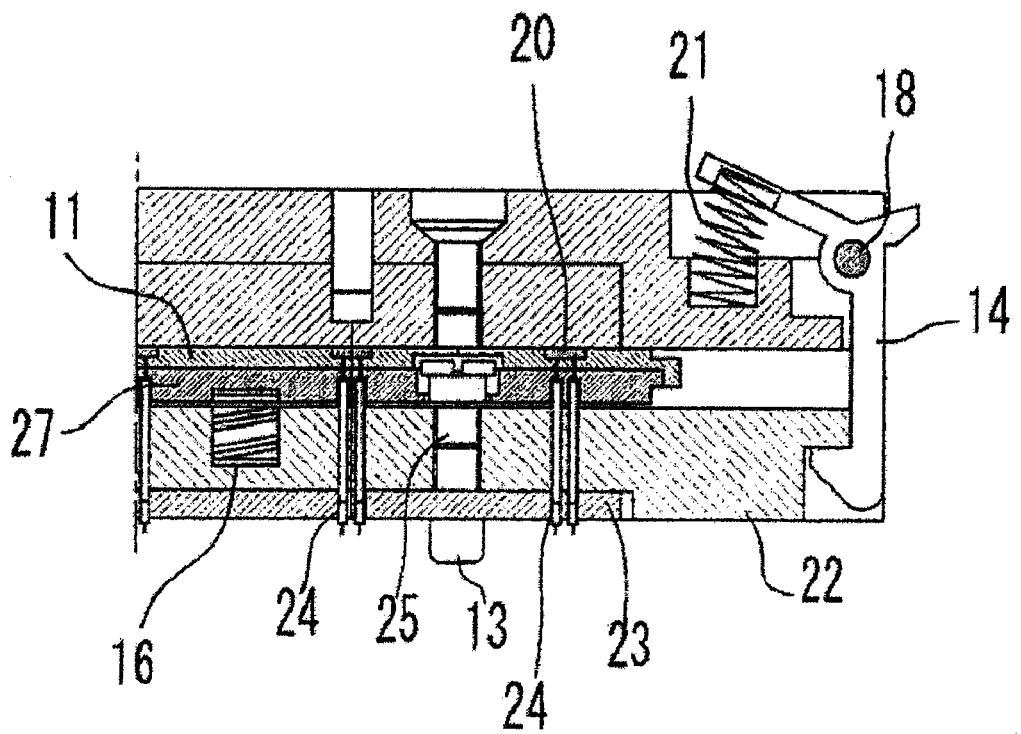
FIG. 1C and FIG. 1D are partial enlarged views of FIG. 1B.

FIG. 1A to FIG. 1D are diagrams showing an embodiment of a test chip socket according to the present invention. As shown in FIG. 1A, FIG. 1B and FIG. 1C, a test chip socket 1 consists of at least a contact block 16, a tray 11, a cover 12. The contact block 16 is fixed on a tester substrate 28. The tray 11 on which test target chips 20 are mounted is mounted on the contact block 16, and it is fixed to the contact block 16 in a state of being put in between the contact block 16 and the cover 12 by combining the cover 12 with the contact block 16.

Figure 2A:
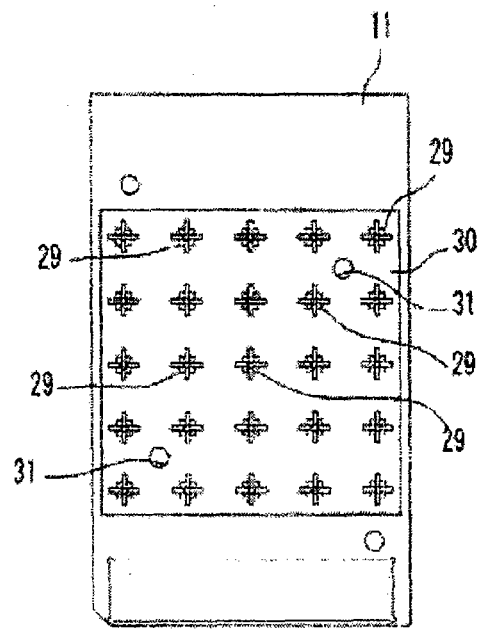
FIG. 2A is a plan view of a tray according to the embodiment of the present invention.
Figure 2B:
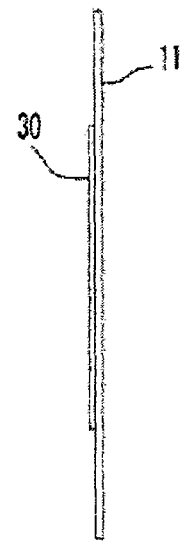
FIG. 2B and FIG. 2C are side views of the tray.
Figure 2C:

As shown in FIG. 2A, FIG. 2B and FIG. 2C, the tray 11 is a plate type, and for example, formed of injection molded resin. Plurality of mounting sections 29 for respectively mounting one test target chip are formed on the tray 11. Number of the mounting sections 29 for one tray 11 is arbitral, however; number of the test target chips that can be tested at once can be increased by increasing the number of the mounting sections 29.

Each mounting sections 29 is marked off as a concave part surrounded by a convex part 30. A shape of the mounting section 29 is designed to fix a test target chip exactly. In other words, the test target chip is positioned in the mounting section 29 by the convex part 30. The convex part 30 that positions the test target chip in the mounting section 29 may be formed as a pillar or a wall equipped to each mounting section 29.

When it is defined that a surface on which the convex part 30 of the tray 11 is formed is a head (right) surface, a concave part 34 surrounded by walls is formed on a tail (reverse) surface. The convex part 30 is loosely fixed in the concave part 34, and the concave part 34 is designed to be a shape that all the circumference of the edge of the walls surrounding the circumference of the concave part 34 is contacted with upper surface of the tray 11 underneath. The concave part and the convex part corresponding to the right and reverse surfaces of the tray 11 are formed, and the height of the convex part is designed not to project the test target chip from the upper surface of the convex part 30 in a state that the test target chip is mounted in the mounting section 29. That is, the height of the convex part 30 is designed to be higher than the height of the test target chip. By doing that, the tray 11 can be piled up in a state of mounting the test target chip. Also, the tray 11 can be piled up without a space at the edge by designing the height (H) of the convex part 30 of the right surface is smaller than the depth (D) of the concave part 34 on the reverse surface. As a result, it can be prevented that dust is stuck to the test target chip mounted in the mounting section 29 and held by the concave part 34. When plurality of the trays 11 are piled up, the upper most tray 11 will work as an anti-dust cover if no test target chip is mounted on the upper most tray 11.

Pierced holes 33 through which probes described later pierce are formed at the bottom of the concave part forming the mounting section 29.

Figure 3A:
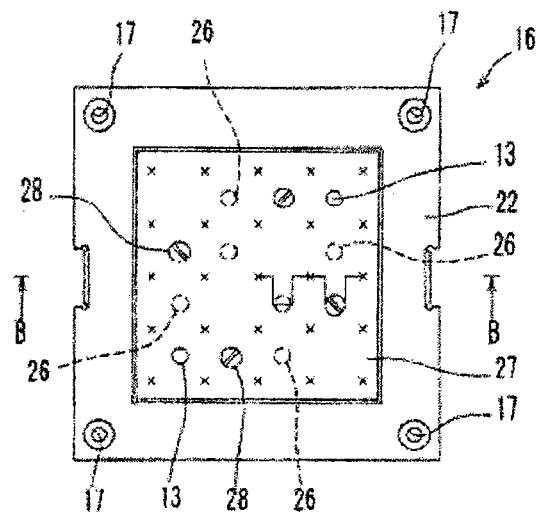
FIG. 3A is a plan view of a contact block according to the embodiment of the present invention.
Figure 3B:
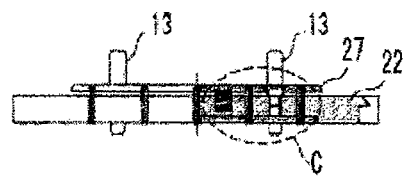
FIG. 3B is a partial sectional view between the line B to B shown in FIG. 3A.
Figure 3C:
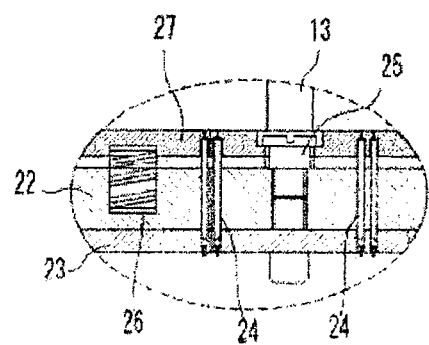
FIG. 3C illustrates an enlarged view of the section of the contact block labeled C in FIG. 3B.

As shown in FIG. 3A, FIG. 3B and FIG. 3C, the contact block 16 consists of an upper base 22, a lower base 23 and a table 27. The lower base 23 and the upper base 22 are connected with each other by plurality of screws 28 and are fixed on the tester substrate by screws (not shown in the drawings) that are inserted into piercing holes 17. The table 27 is fixed on the upper base 22 by screws 25 and is supported at a position that is distant from the upper base 22 by plurality of springs 26 arranged between the upper base 22 and the table 27.

Guide rods 13 are fixed on the lower base 23 and each pierces through the upper base 22 and the table 27 to project from the up and down of the contact block 16. The guide rods 13 position the lower base 23, the upper base 22 and the table 27. Also, the guide rods 13 position the contact block 16 to the tester substrate and have a function to position the tray mounted on the table 27 to the contact block 16.

As shown in FIG. 1A, FIG. 1B and FIG. 1C, the cover 12 binds the tray 11 with the contact block 16 and covers all of the plurality of the test target chips 20 mounted on the tray 11. Piercing holes 10 to insert the guide rods 13 are formed on the cover 12. The cover 12 is hooked on the contact block 16 by two nails 14 in a state the guide rods 13 are inserted into the piercing holes 10. The two nails 14 are held respectively by the cover 12 with shafts 18 and are pushed by the springs 21 in a direction that the tips of the nails 14 are approaching each other. When the tips of the nails are hung on the convex part of the upper base 22, the cover 12 and the contact block 16 are connected by elasticity of the spring 21. When the tips of the nails 14 are released from the convex part of the upper base 22, the cover 12 is released from the contact block 16. Then, the tray 11 can be removed from the block 16.

Figure 1D:
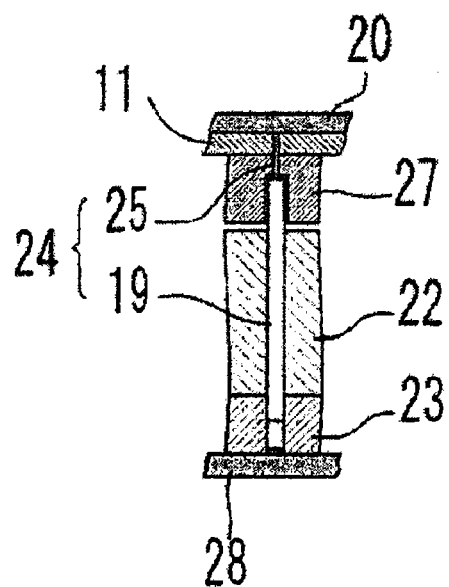

As shown in FIG. 1C, FIG. 1D and FIG. 3C, plurality of the probes 24 are held by the contact block 16. More specifically, piercing holes to which the probes 24 are inserted respectively are formed on the upper base 22 and the table 27. The lower side radius of the piercing hole formed on the lower base 23 is smaller than the upper side radius. The upper side radius of the piercing hole formed on the table 27 is smaller than the upper side radius. Since the both edges of the probe 24 are tapered stick type, it is held by the contact block 16 in a state of being hung and fixed on a step of the inner wall side of the piercing hole formed respectively on the lower base 23 and the table 27.

As shown in FIG. 1D, the probe 24 has a body and a contact pin that is inserted into the body and is pushed from the body 19 to the projecting direction by a spring (not shown in the drawings). When the cover 12 is connected with the contact block 16 in a state that the empty tray 11 is mounted on the table 27 of the contact block 16 that is not fixed on the tester substrate 28, the table 27 is pushed into the upper base side 22 by the tray 11, and the probes 24 are projected from the bottom side of the mounting section 29 of the tray 11 and from the bottom of the contact block 16. The contact block 16 is fixed on the tester substrate 28. When the test target chip 20 is mounted on the mounting section of the tray 11, the both edges of the probe 24 are contacted with a terminal of the test target chip 20 and a terminal of the tester substrate 28. Therefore, the test target chip 20 and the tester substrate 28 are electrically connected with each other.

Figure 4:
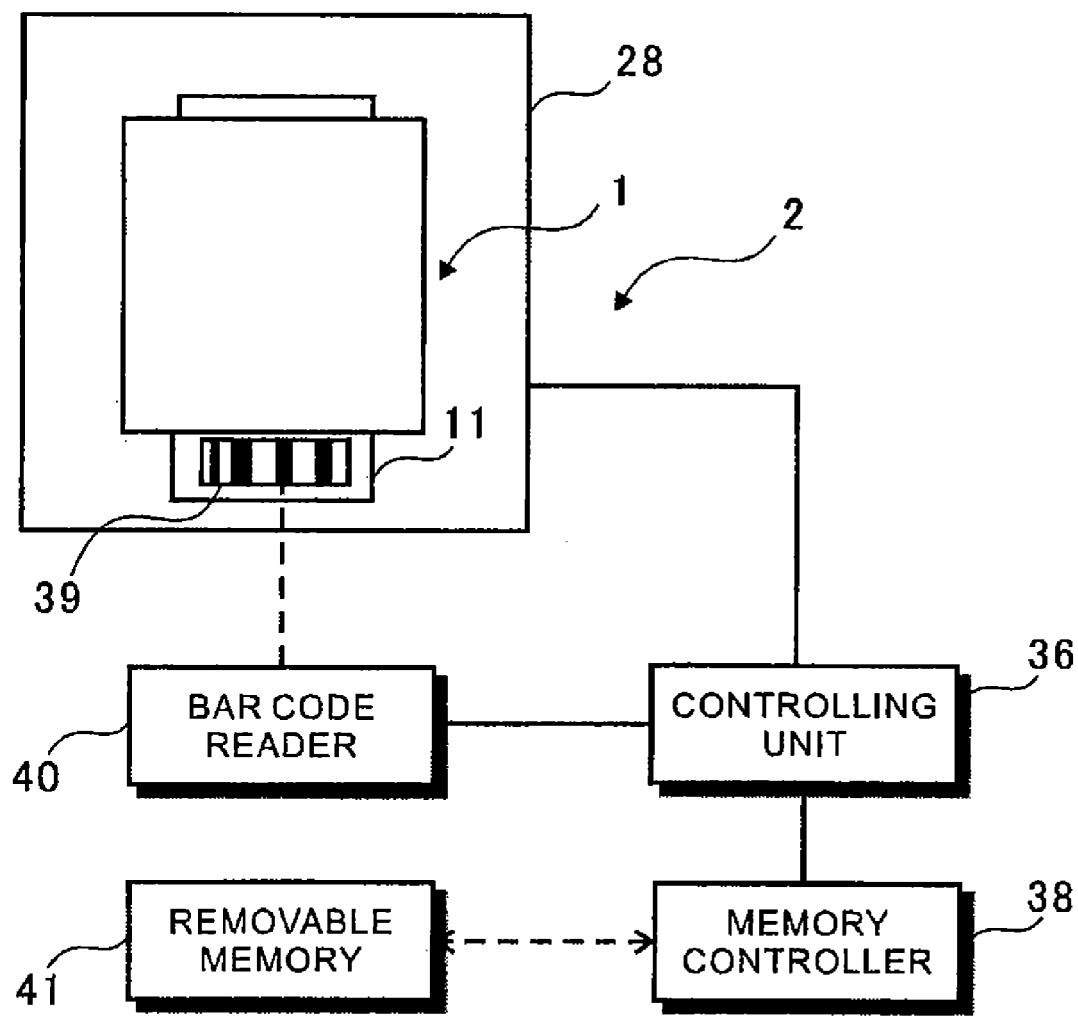
FIG. 4 is a block diagram of a test system according to the embodiment of the present invention.

FIG. 4 shows a test system according to the embodiment of the present invention. A test system 2 consists of the tester substrate 28, a controlling unit 36, a bar code reader 40, a memory controller 38, etc. The tester substrate 28 generates a test signal corresponding to a controlling signal output from the controlling unit 36 and is a printed wiring substrate for inputting the test signal to the test target chip via the probe 24. Also, the tester substrate 28 generates test result data showing test result of the test target chip by mounting section based on the output signal that is output by each test target chip to output to the controlling unit 36. The controlling unit 36 as data obtaining means is consisted as a computer and inputs the test signal to the test target chip via the tester substrate 28 to obtain the test result data. The bar code reader 40 reads a tray ID as identifying data of the tray 11 from the bar code for identifying the tray 11. The bar code for identifying the tray 11 is displayed by, for example, sticking a bar code label 39 on the tray 11. The identifying data for identifying the tray 11 may be put in the tray 11 as a magnetic data. The controlling unit 36 relates the tray ID obtained from the bar code reader 40 with the test result data obtained from the tester substrate 28 by each tray 11 to output the tray ID and the test result data to a removable memory 41 via the memory controller 38.

Figure 5:
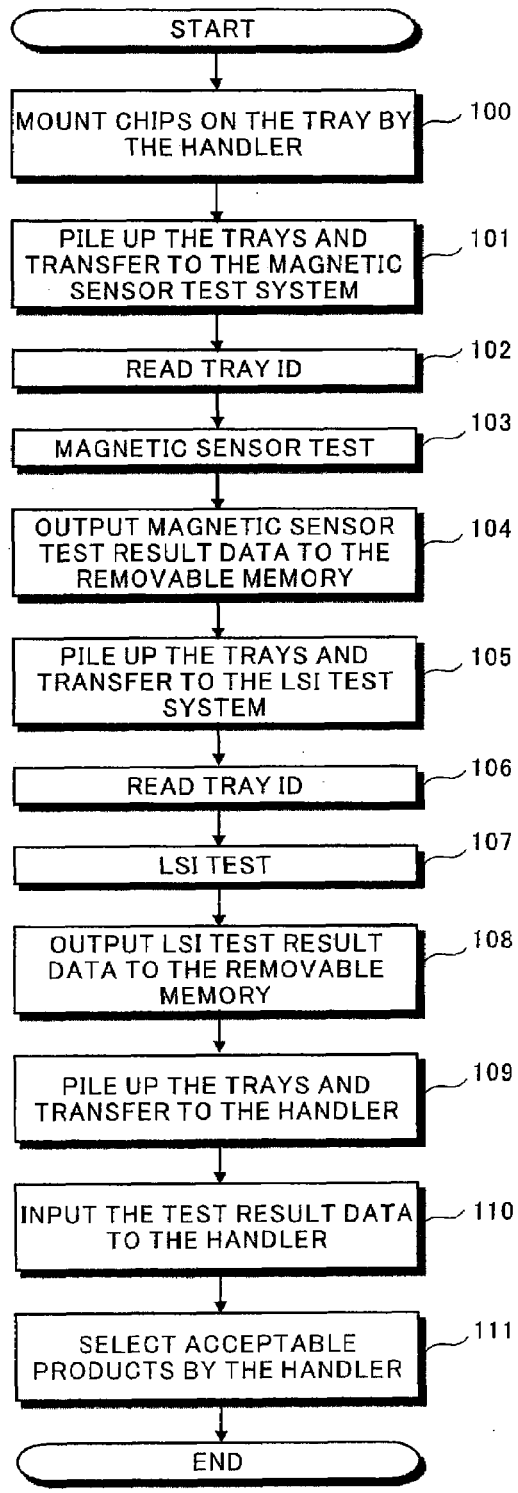
FIG. 5 is a flow chart showing a testing method according to the embodiment of the present invention.

FIG. 5 is a diagram showing a test method according to the embodiment of the present invention. The test method shown in FIG. 5 is to test a magnetic sensor chip that equips with a magnetic sensor, a multiplexer, an AD converting circuit, a DA converting circuit and the like as the test target chip in a chipped state.

In the first place, a process for removing one magnetic sensor chip as a test target chip from a transferring tray mounting plurality of magnetic sensor chips by a handler and mounting the removed magnetic sensor chip to the mounting section 29 of the tray 11 of the test chip socket 1 is repeated (Step S101). Since the tray 11 can be handled independently and plurality of the magnetic sensor chips can be mounted on the tray 11, the process to mount plurality of the magnetic sensor chips on the tray 11 by using the handler can be automated.

Figure 2D:
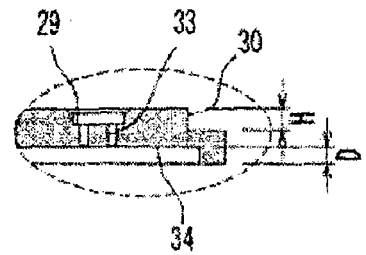
FIG. 2D is an enlarged view of D part in FIG. 2C.

The trays 11 all of which mounting sections are mounted with the magnetic sensor chips are sequentially piled up, and the piled trays 11 are transferred to the magnetic test system (S102). At this time, since the convex part 30 is fixed in the concave part 34 as shown in FIG. 2D, plurality of the trays 11 can be piled up without pulling down. Also, when the trays are piled up, the magnetic sensor chips mounted in the mounting sections 29 are shut by the upper and the lower trays 11. Therefore, the magnetic sensor chips will not fell out and will not be contaminated during transferring the trays 11.

Next, the tray ID is read out by each tray 11 in the magnetic sensor system (Step S102), and the magnetic sensor test to plurality of the magnetic sensor chips mounted on the tray 11 is executed at once (Step S103).

The magnetic sensor test system equips a magnetic field generator in the above described test system 2. The magnetic field generator generates a magnetic field for testing a magnetic sensor chip in a field where the test chip socket 1 is fixed. Since the test chip socket 1 can hold plurality of the magnetic sensors in a small field on the tray 11, output of the magnetic field generator can be decreased according to the embodiment of the present invention. In the magnetic sensor test system, the test chip socket 1 is fixed by screw on the tester substrate 28 in a state that the tray 11 is removed.

An operating person picks two nails 14 to remove the cover 12 from the contact block 16, and mounts the tray 11 on the table 27 in order to insert the guide rods 13 projecting from the table 27 to the piercing holes 31. In this state, when the operating person covers the cover 12 over the tray 11 to hang the nails 14 on the contact block 16, the tray 11 will be fixed on the contact block 16 in a state of being positioned by the guide rods 13. Since the number of the magnetic sensor chips to be arranged on the tray 11 is larger than the number of the contact blocks 16 to be arranged on the tester substrate 28, the number of the magnetic sensor chips that can be tested at once can be increased according to the embodiment of the present invention.

When the magnetic field generator generates a magnetic field in a field equipped with the test chip socket 1, an output signal is output from each of the magnetic sensor chips mounted on the tray 11 to the tester substrate 28. The tester substrate 28 generates the test result data of the magnetic sensor corresponding to the output signals input from plurality of the magnetic sensor chips and output the test result data of the magnetic sensors to the controlling unit 36.

Next, the controlling unit 36 correlates the test result data of the magnetic sensor obtained from the tester substrate 28 with the tray ID obtained from the bar code reader 40 and outputs the test result data of the magnetic sensors to the removable memory 41 via the memory controller 38 (Step S104).

When the magnetic sensor test of the magnetic sensor chips mounted on one tray 11 is completed, the tray 11 is removed from the test chip socket 1, and plurality of the trays 11 which are sequentially removed from the test chip socket are transferred to a LSI test system in a state of being piled up (Step S105).

In the LSI test system, the tray ID is read out by each tray 11 by the bar code reader 40 (Step S106), and the LSI test is executed to plurality of the magnetic sensor chips mounted on the tray 11 at once (Step S107).

The LSI test system is the above described test system 2 designed for testing the LSI as a signal process circuit composing a multiplexer, an AD converting circuit, a DA converting circuit, etc. which are equipped on the magnetic sensor chip. In the LSI test system, when the tray 11 is fixed on the contact block 16, and when the test signal is input to the magnetic sensor chip, the output signal is output from each of plurality of magnetic sensor chips mounted on the tray 11 to the tester substrate 28. The tester substrate 28 generates the LSI test result data corresponding to the output signals input from plurality of the magnetic sensor chips and outputs the LSI test result data to the controlling unit 36.

Next, the controlling unit 36 correlates the tray ID obtained from the bar coder reader 40 with the LSI test result obtained from the tester substrate 28 to output to a removable memory 41 via the memory controller 38 (Step S108).

FIG. 6 is a diagram showing an example of data recorded in the removable memory 41 when the magnetic sensor test and the LSI test is completed. Fort example, the magnetic sensor test system and the LSI test system correlate the magnetic sensor test result data and the LSI test result data with the tray 11 and the section ID and record them in the removable memory 41 by generating and editing the record of the database that can be used by the handler as shown in FIG. 6. The section ID is unique for each mounting section 29 of the tray 11, and the tray ID is unique for each tray 11.

When the LSI test of the magnetic sensor chips mounted on one tray 11 is completed, the tray 11 is removed from the test chip socket. Then, plurality of the removed trays 11 is sequentially transferred to the handler in a state of being piled up (Step S109).

The magnetic sensor test result data and the LSI test result data corresponding to plurality of the trays recorded in the removable memory 41 are input to the handler (Step S110).

The handler has a bar code reader for reading out the tray ID from the tray 11, a robot arm for transferring the chip and a controlling unit to obtain the magnetic sensor test result data and the LSI test result data from the removable memory 41 for each tray 11 and for each mounting section 29.

The controlling unit of the handler obtains the magnetic sensor test result data and the LSI test result data corresponding to the tray ID read from the tray 11 for one section ID. When both of the obtained magnetic sensor test result data and the LSI test result data are passed in the tests ("1" is an example of a passed value in FIG. 6), the controlling unit of the handler judges the magnetic sensor chip mounted in the mounting section 29 corresponding to the section ID as an acceptable product. The accepted magnetic sensor chips are transferred from the tray 11 to the accepted chip tray by the robot arm controlled by the controlling unit. The rejected magnetic sensor chips are transferred from the tray 11 to a rejected chip tray by the robot arm. As a result, the accepted magnetic sensor chips are sorted (Step S111).

As described in the above, according to the embodiment of the present invention, the tray can be handled independently. Since plurality of the magnetic sensor chips can be mounted on the tray 11, the processes of removing the magnetic sensor chips from the tray 11 by the handler and sorting the magnetic sensor chips can be automated. Also, since the test result data output from the two test systems is correlated with the tray ID by each magnetic sensor chip to be managed, sorting of the accepted magnetic sensor chips as test target chips can be automated by controlling the handler by using the managed test result data. Moreover, since the test result data output from the two test systems is correlated with the tray ID by each magnetic sensor chip to be managed, plurality of the test target chips can be handled in a state of being mounted on the tray 11 when the test target chips are transferred in the two test systems. Furthermore, since the trays 11 can be handled in a state of being piled up, large number of test target chips can be handled at once. Therefore, according to the test method as described in the above, cost for the test process of the magnetic sensor chips can be reduced.

The present invention has been described in connection with the preferred embodiments. The invention is not limited only to the above embodiments. It is apparent that various modifications, improvements, combinations, and the like can be made by those skilled in the art. For example, transfer of the test result data between the test systems or between the test system and the handler may be executed by a communication line or paper instead of the removable memory 41.

The invention claimed is:

1. A test chip socket adapted to be fixed to a tester substrate, the test chip socket comprising:
    a contact block fixable to the tester substrate;
    a test chip tray mounted to the contact block, the test chip tray having a convex part for positioning test target chips to a plurality of mount positions;
    a plurality of probes which are held by the contact block and contact the tester substrate and the plurality of test target chips, wherein each probe contacts with a respective terminal of a respective test target chip mounted to the mount position when the test chip tray mounting the plurality of the test target chips is fixed to the contact block; and
    a cover that covers the test target chips mounted on the tray and fixes the tray to the contact block,
    wherein the tray comprises piercing holes to which the probes are inserted, the piercing holes being formed in each of the plurality of mount positions,
    wherein the contact block comprises a base to which the probes are fixed, a table through which the probes pierce and on which the tray is placed, and a spring that supports the table at a position separated from the base,
    wherein the cover connects to the base in a condition that the table is pushed into the base, and
    wherein each of the probes contacts with the respective terminal of the respective test target chip exposed through the piercing hole when the cover connects with the base.

2. The test chip socket according to claim 1, further comprising:
    a positioning hole formed on the tray; and
    a guide rod that is formed on the contact block and is inserted to the positioning hole.

3. The test chip socket according to claim 1, wherein the test chip tray comprising comprises:
    convex parts that are higher than height of the test target chip, each convex part being formed in the mount position on one main surface of the test chip tray for positioning the test target chip; and
    concave parts formed on another main surface, and
    wherein each convex part can be set into each concave part so as to pile up a plurality of test chip trays.

4. A method for testing a chip by using a test socket having a contact block fixed to a tester substrate, the method comprising the steps of:
    mounting test target chips to a plurality of the mount positions in a tray of the test socket, the tray having convex parts for positioning the test target chips to the plurality of mount positions, wherein a plurality of probes are held by the contact block and contact the tester substrate and the test target chips, wherein each probe contacts a respective terminal of a respective test target chip when the tray mounting the plurality of the test target chip is fixed to the contact block;
    reading identification data from the tray using a reader;
    obtaining, by a data obtaining device, test result data that represents test results of the test target chips mounted to each mount position via the tester substrate in a condition that the contact block fixes the tray to which the test target chips are mounted;
    outputting, by an output device, the test result data by correlating test result data with the identification data;
    removing the tray from the contact block;

selecting an acceptable chip from the plurality of the test target chips mounted to the tray in accordance with the test result data correlated with the identification data of the removed tray.

5. The method for testing a chip according to claim 4, wherein the act of obtaining test result data is performed by providing a magnetic field to the test target chips.

6. The method for testing a chip according to claim 4, wherein the tray is made of injected molded resin and the identification data is represented by a bar code.

7. The method for testing a chip according to claim 4, wherein the act of selecting acceptable chips further comprises determining whether the test target chips are acceptable or unacceptable in accordance with the test results represented by the mount positions and removing unacceptable test target chips.

* * * * *